United States Patent [19]

Fung

[11] Patent Number: 5,731,960
[45] Date of Patent: Mar. 24, 1998

[54] LOW INDUCTANCE DECOUPLING CAPACITOR ARRANGEMENT

[75] Inventor: Laurie P. Fung, Pleasanton, Calif.

[73] Assignee: Bay Networks, Inc., Santa Clara, Calif.

[21] Appl. No.: 716,842

[22] Filed: Sep. 19, 1996

[51] Int. Cl.$^6$ .................................................. H05K 1/18
[52] U.S. Cl. ........................ 361/782; 361/760; 361/767; 361/807; 361/808; 174/260; 174/261; 257/723; 257/724; 257/700; 228/180.21; 228/180.22
[58] Field of Search .......................... 361/782, 760, 361/763, 765, 767, 777, 807, 808, 768, 772, 748, 719, 720; 174/260, 261; 257/723, 724, 700; 228/180.21, 180.22

[56] References Cited

U.S. PATENT DOCUMENTS

| | | | |
|---|---|---|---|
| 4,274,124 | 6/1981 | Feinberg et al. | 361/275 |
| 4,439,813 | 3/1984 | Dougherty et al. | 361/321 |
| 4,500,848 | 2/1985 | Marchand et al. | 330/285 |
| 4,670,770 | 6/1987 | Tai | 357/60 |
| 4,675,717 | 6/1987 | Herrero et al. | 357/71 |
| 4,679,172 | 7/1987 | Kirsch et al. | 365/222 |
| 4,703,288 | 10/1987 | Frye et al. | 333/1 |
| 4,704,550 | 11/1987 | Hechtman | 307/571 |
| 4,720,402 | 1/1988 | Wojcik | 427/282 |
| 4,720,741 | 1/1988 | Schaaf et al. | 357/72 |
| 4,744,008 | 5/1988 | Black et al. | 361/386 |
| 4,882,656 | 11/1989 | Menzis, Jr. et al. | 361/393 |
| 4,893,071 | 1/1990 | Miller | 324/660 |
| 4,901,013 | 2/1990 | Benedetto et al. | 324/158 F |
| 4,945,399 | 7/1990 | Brown et al. | 357/74 |
| 5,099,395 | 3/1992 | Sagisaka et al. | 361/792 |
| 5,384,433 | 1/1995 | Osann, Jr. et al. | 174/250 |
| 5,425,647 | 6/1995 | Mencik et al. | 439/83 |
| 5,453,581 | 9/1995 | Liebman et al. | 174/261 |
| 5,459,642 | 10/1995 | Stoddard | 361/774 |

*Primary Examiner*—Leo P. Picard
*Assistant Examiner*—David Foster
*Attorney, Agent, or Firm*—Blakely, Sokoloff Taylor & Zafman

[57] ABSTRACT

A noise suppression apparatus for a printed circuit board (PCB) having two PCB pad regions, each containing a boundary pad region and a mounting pad region, wherein both boundary pad regions contain via connections. A decoupling capacitor is coupled to both mounting pad regions. Both boundary pad regions are solder mask except the mounting pad regions and the via connections.

17 Claims, 2 Drawing Sheets

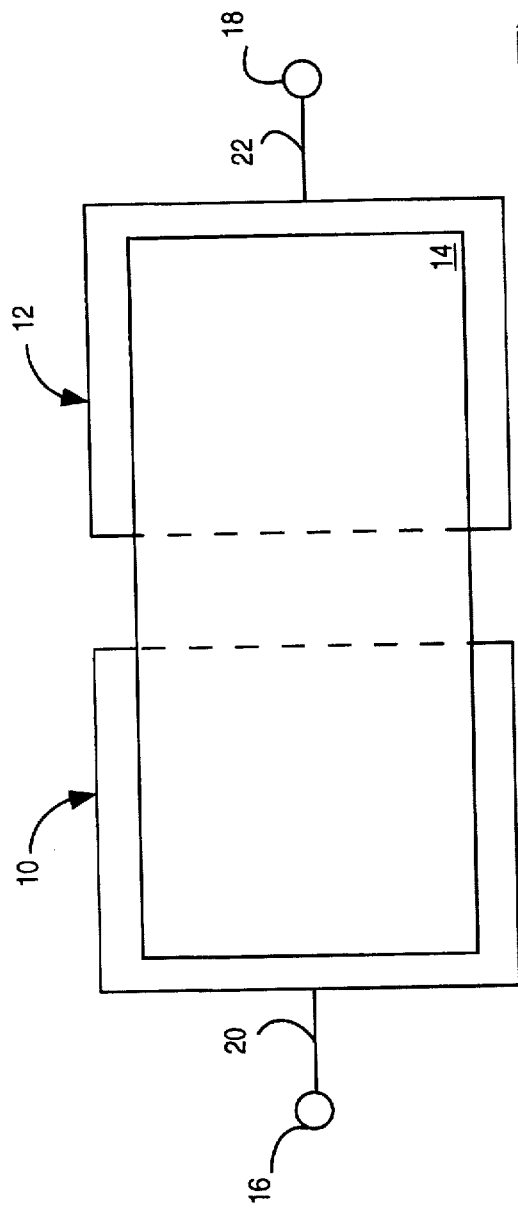
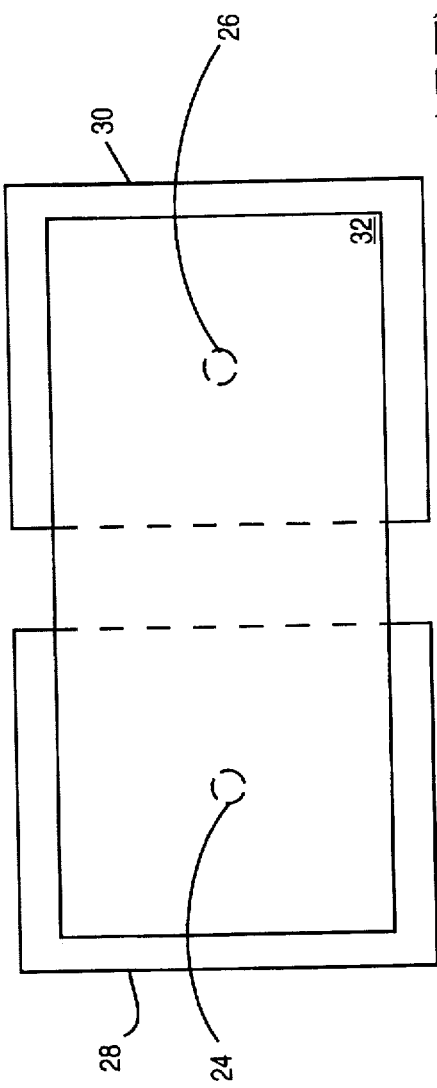
FIGURE 1 (PRIOR ART)
FIGURE 2 (PRIOR ART)

LOW INDUCTANCE DECOUPLING CAPACITOR ARRANGEMENT

FIELD OF THE INVENTION

The present invention relates to the field of decoupling capacitors; more particularly, the present invention relates to low inductance decoupling capacitors for use in high speed switching arrangements.

BACKGROUND OF THE INVENTION

As large scale integrated circuits operate at increasingly higher speeds, the need for devices to operate at faster switching rates has increased. These higher speed circuits are typically expensive. As switching rates increase, problems which do not exist at lower speeds, such as maintaining sufficient electrical noise isolation and limiting inductance between components, become increasingly problematic. Thus, a fundamental electrical problem is the tradeoff between the cost of high speed circuitry and the better signal quality that results from their use.

A prior art technique for reducing noise level and limiting inductance in surface mount technology (SMT) devices has been to employ the use of discrete decoupling capacitors. It has been found that utilization of decoupling capacitors in high speed switching modules can reduce the amount of noise in a circuit. The effective inductance of semiconductor chip and package power paths for active switching circuits relates directly to the amount of power distribution noise. Thus, effective use of decoupling capacitors in high speed applications has become essential for good performance at high speeds.

Typically, a decoupling capacitor is mounted over a pair of SMT pads and connected by power line trace connections, as illustrated in FIG. 1. In FIG. 1, adjacent SMT pads 10 and 12 are coupled by a decoupling capacitor 14. Vias 16 and 18 are positioned away from SMT pads 10 and 12, and are connected to power and ground, respectfully. Trace connections 20 and 22 connect the vias 16 and 18 to the SMT pads 10 and 12. Thus, power and ground are supplied through the vias 16 and 18, along the trace connections 20 and 22, to SMT pads 10 and 12.

One problem with this decoupling capacitor arrangement is that the trace connections 20 and 22 have an inductance that causes increased noise when used in high speed environments. Specifically, as the amount of current flowing through trace connections 20 and 22 increases, a voltage drop develops across the trace connections, causing unwanted power distribution noise. The noise effects performance.

In an alternate prior art decoupling capacitor arrangement, a capacitor is mounted onto a SMT pad with the power and ground being supplied to the decoupling capacitor through vias beneath the decoupling capacitor, as illustrated in FIG. 2. Referring to FIG. 2, vias 24 and 26 are positioned on adjacent SMT pads 28 and 30, and are connected to power and ground, respectfully. A decoupling capacitor 32 is positioned onto the SMT pads 28 and 30 and the vias 24 and 26. Typically, a solder connection is used such that the decoupling capacitor 32 is soldered directly to the SMT pads 28 and 30 for electrical connection to the vias 24 and 26. In this manner, noise and inductance pathways are reduced because the inductance associated with the trace connections is eliminated. However, during the process of soldering the decoupling capacitor 32 to the SMT pad 28 and 30, special steps must be taken to prevent solder from flowing into the vias 24 and 26 due to thermal suction. These extra processing steps invariably add cost to the manufacturing process, which is desirable to avoid.

The present invention provides a decoupling capacitor arrangement that eliminates the lead inductance associated with the use of trace connections, while avoiding the thermal suction problems discussed above. In such a manner, a decoupling capacitor arrangement is provided for use on high speed switching applications.

SUMMARY OF THE INVENTION

A noise suppression device for a printed circuit board (PCB) is described. The noise suppression device may be used to reduce electrical noise and limit the amount of inductance associated with increased switching rates on a printed circuit board. The noise suppression device also reduces noise and inductance without introducing thermal suction problems during the soldering process.

A PCB comprises two PCB pad regions, each containing a boundary pad region and a mounting pad region, wherein the boundary pad regions contain at least one electrically conductive via connection. The mounting pad regions are separated from the via connections by a portion of the boundary pad regions. A decoupling capacitor is coupled to the mounting pad regions.

Accordingly, the described arrangement results in reducing the inductance in conductivity, allowing for improved decoupling effect and faster noise suppression.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 1 illustrates a top view of a prior art decoupling capacitor arrangement.

FIG. 2 illustrates a top view of another prior art decoupling capacitor arrangement.

DETAILED DESCRIPTION OF THE PRESENT INVENTION

A noise suppression device exhibiting extremely low inductance for a printed circuit board (PCB). In the following description, numerous details are set forth, such as distances between components, etc. It will be apparent, however, to one skilled in the art, that the present invention may be practiced without these specific details. In other instances, well-known structures and devices are shown in block diagram form, rather than in detail, in order to avoid obscuring the present invention.

The present invention provides a decoupling capacitor arrangement in which a decoupling capacitor is coupled to two PCB pads. Each PCB pad region contains a boundary pad region and a mounting pad region. The boundary pad regions contain electrically conductive via connections. The mounting pad regions are separated from the via connections by a portion of the boundary pad regions.

Figure 3:
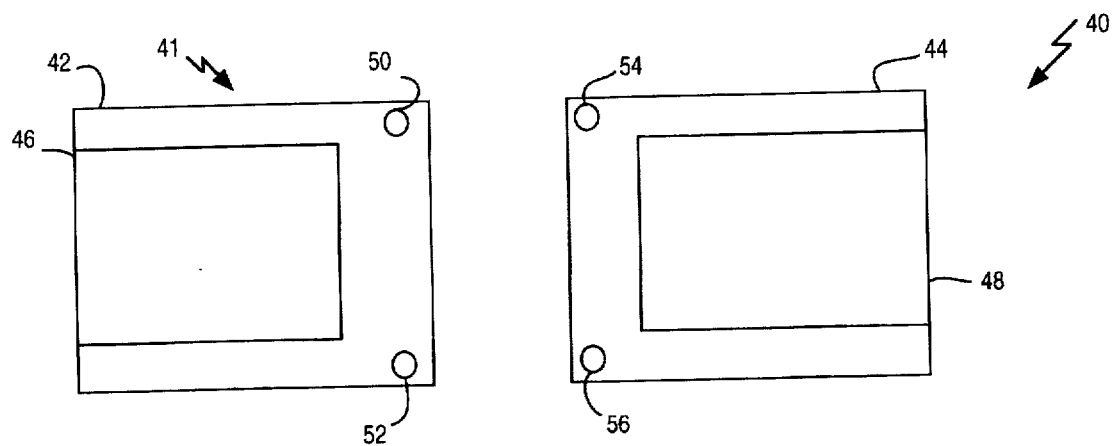
FIG. 3 illustrates a top view of a portion printed circuit board having a pair of printed circuit board pads.

FIG. 3 illustrates a pair of printed circuit board (PCB) pads, which when coupled to a decoupling capacitor, form an effective noise reduction and eliminate trace inductance. Referring to FIG. 3, a pair of PCB pads 40 and 41 are shown. Each of PCB pads 40 and 41 include a pair of boundary pad regions 42 and 44, which are aligned with each other. Typically, the boundary pad regions 42 and 44 are comprised of copper, or another material of similar conductivity and thermal properties.

Each of PCB pads 40 and 41 further comprise mounting pad regions 46 and 48, respectfully. In one embodiment, mounting pads 46 and 48 are surface mount technology (SMT) soldering pads. In one embodiment, the boundary pad region comprises the entire area of the PCB pad, with each mounting pad region being positioned on a boundary pad region. Both of the boundary pad regions 42 and 44 include a solder mask except in the area of mounting pad regions 46 and 48.

Figure 4:
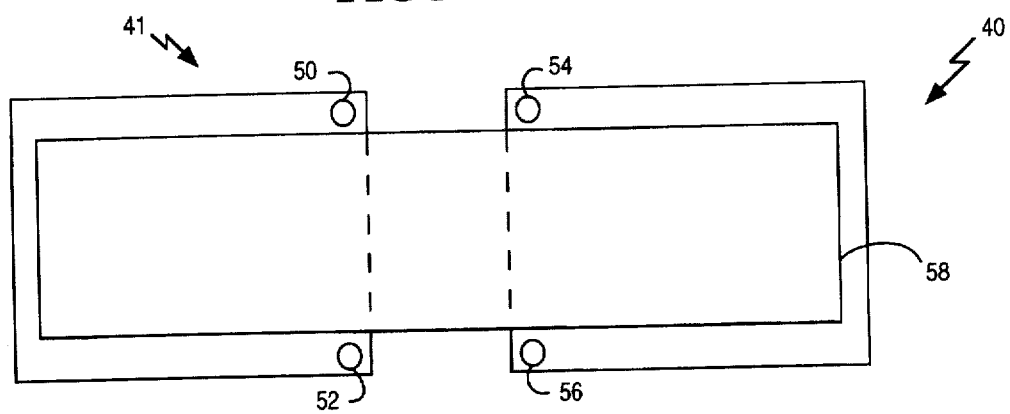
FIG. 4 illustrates a top view of a pair of printed circuit board pads with a mounted decoupling capacitor.

The mounting pad regions 46 and 48 are coupled to a decoupling capacitor 58 as illustrated in FIG. 4. The solder mask around the mounting pad regions 46 and 48 prevents spreading of solder or other coupling material onto other portions of boundary pad regions 42 and 44 when the decoupling capacitor 58 is being soldered to PCB pads 40 and 41. The mounting pad regions 46 and 48 typically comprise copper with tin plating, or a material of similar conductivity and thermal properties.

Two pairs of via connections 50, 52, 54 and 56 are in the boundary pad regions 42 and 44. These via connections are not solder masked. Any number of vias can be used (e.g. one per PCB pad), with the one limiting factor being cost. However, at some point, the use of additional vias would have only a minimal effect. In one embodiment, two pairs of vias are used, one for each PCB pad. Vias 50, 52, 54, and 56 are electrically conductive and connect to power and ground (not shown), which are routed from elsewhere on the PCB. Vias 50 and 52, for example, are coupled to power, and vias 54 and 56 are coupled to ground.

As illustrated in FIG. 4, the decoupling capacitor 58 is coupled to the mounting pad regions 46 and 48, effectively creating an electrical bridge between the two PCB pads. In one embodiment, the decoupling capacitor 58 is soldered to the mounting pad regions 46 and 48, such that the decoupling capacitor 58 does not overlap the via connections 50, 52, 54, and 56. This results in creating an effective thermal barrier between the decoupling capacitor 58 on the mounting pad regions 46 and 48 and the vias 50, 52, 54, and 56.

During the mounting process, the solder mask in the boundary pads 42 and 44 prevent solder from entering via connections 50, 52, 54 and 56. Since solder does not get into the vias, thermal suction problems are avoided. In addition, placement of the vias 50, 52, 54 and 56 in this manner becomes a more effective decoupling arrangement, because no traces are required for access to power and ground. Thus, the trace inductance no longer limits the conductance capability, thereby reducing the overall inductance and allowing for faster decoupling effect and faster noise suppression.

Decoupling capacitor 58 can be any standard capacitor. In one embodiment, a capacitor in the range of about 0.001 microfarads to about 0.1 microfarads is used.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the preferred embodiment are not intended to limit the scope of the claims which in themselves recite only those features regarded as essential to the invention.

Thus, an extremely low inductance noise suppression device has been described.

I claim:

1. A printed circuit board (PCB) comprising:
   a first pad having a first boundary pad region containing at least one first electrically conductive via connection and a first mounting pad region separated from said at least one first electrically conductive via connection by a solder mask on the first boundary pad region;
   a second pad having a second boundary pad region containing at least one second electrically conductive via connection and a second mounting pad region separated from said at least one second electrically conductive via connection by a solder mask on the second boundary pad region; and
   a decoupling capacitor coupled to the first mounting pad region and the second mounting pad region.

2. The apparatus of claim 1, wherein the solder mask on the first boundary pad region operates as a thermal barrier between the first mounting pad region and said at least one first electrically conductive via connection.

3. The apparatus of claim 1, wherein the solder mask on the second boundary pad region operates as a thermal barrier between the second mounting pad region and said at least one second electrically conductive via connection.

4. The apparatus of claim 1, wherein the decoupling capacitor is coupled without overlapping either said at least one first or second electrically conductive via connections.

5. The apparatus of claim 1, wherein power and ground are supplied to the pads using said at least one first or second electrically conductive via connections.

6. The apparatus of claim 1, wherein the first and second mounting pad regions comprise copper with tin plating.

7. The apparatus of claim 1, wherein the first and second mounting pad regions are surface mount technology pads.

8. A printed circuit board (PCB) comprising:
   a plurality of PCB pads, said PCB pads comprising
      a boundary pad region containing at least one electrically conductive via connection; and
      a mounting pad region separated from said at least one electrically conductive via connection by a portion of the boundary pad region with a solder mask; and
   a decoupling capacitor coupled to the first mounting pad region and the second mounting pad region.

9. The apparatus of claim 8, wherein the solder mask on the boundary pad region operates as a thermal barrier between the mounting pad region and said at least one electrically conductive via connection.

10. The apparatus of claim 8, wherein the decoupling capacitor is coupled to a mounting pad without overlapping said at least one electrically conductive via connection.

11. The apparatus of claim 8, wherein power and ground are supplied to the plurality of PCB pads using said at least one electrically conductive via connection.

12. The apparatus of claim 8, wherein the mounting pad region comprise copper with tin plating.

13. The apparatus of claim 8, wherein the mounting pad region comprises a surface mount technology (SMT) pad.

14. A method of suppressing noise on a printed circuit board (PCB) comprising the steps of:
   aligning a decoupling capacitor over a first PCB pad and a second PCB pad, wherein the first PCB pad has a first boundary pad region containing at least one first electrically conductive via connection, and the second PCB pad has the second boundary pad region containing at least one second electrically conductive via connection; and mounting a decoupling capacitor to first and second mounting pad regions of said first and second PCB pads, respectively, without overlaying said at least one first and second electrically conductive via connections.

15. The method of claim 14, wherein the solder mask of the first boundary pad region operates as a thermal barrier between the first mounting pad region and said at least one first electrically conductive via connection.

16. The method of claim 14, wherein the solder mask of the second boundary pad region operates as a thermal barrier between the second mounting pad region and said at least one second via connection.

17. The apparatus of claim 16, wherein the first and second mounting pad regions comprise surface mount technology pads.

* * * * *